United States Patent [19]

Lavene

[11] Patent Number: 4,538,205
[45] Date of Patent: Aug. 27, 1985

[54] MEANS AND METHOD FOR FABRICATING PLANAR TERMINATED CAPACITORS

[75] Inventor: Bernard Lavene, Ocean, N.J.

[73] Assignee: Electronic Concepts, Inc., Eatontown, N.J.

[21] Appl. No.: 586,014

[22] Filed: Mar. 5, 1984

Related U.S. Application Data

[63] Continuation-in-part of Ser. No. 348,401, Feb., 1982, Pat. No. 4,455,591.

[51] Int. Cl.³ .................. H01G 1/13; H01L 21/64
[52] U.S. Cl. .................. 361/308; 29/25.42; 29/588
[58] Field of Search .............. 361/308, 309, 433; 29/25.42, 588

[56] References Cited

U.S. PATENT DOCUMENTS

| | | | |
|---|---|---|---|
| 3,134,087 | 5/1964 | Haynman | 338/332 |
| 3,236,936 | 2/1966 | Robinson | 361/308 X |
| 3,244,953 | 4/1966 | Walsh et al. | 361/308 X |
| 3,341,752 | 9/1967 | Fournier | 361/433 |
| 3,456,171 | 7/1969 | Adelson et al. | 361/308 |
| 3,539,885 | 11/1970 | England | 361/308 |
| 3,665,267 | 5/1972 | Acello | 361/309 |
| 3,828,227 | 8/1974 | Millard et al. | 361/433 |
| 4,282,645 | 8/1981 | Thompson et al. | 29/588 X |

FOREIGN PATENT DOCUMENTS

| | | | |
|---|---|---|---|
| 995670 | 8/1951 | France | 361/308 |
| 413746 | 7/1934 | United Kingdom . | |
| 628233 | 8/1949 | United Kingdom | 361/308 |

Primary Examiner—Donald A. Griffin
Attorney, Agent, or Firm—Ratner & Prestia

[57] ABSTRACT

A planar terminated capacitor and a method for fabricating planar terminated capacitors is disclosed wherein a capacitor element is inserted in a nonconductive tubular sleeve. The sleeve extends outwardly beyond the ends of the capacitor element forming cavities at each end of the sleeve. These cavities are filled with a conductive substance and metal end caps are positioned at the ends of the sleeve substantially enclosing the cavities. The conductive substance electrically couples the end caps to the ends of the capacitor element.

9 Claims, 2 Drawing Figures

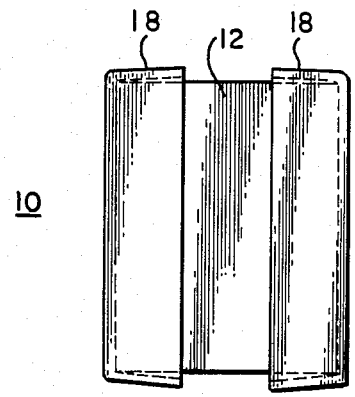
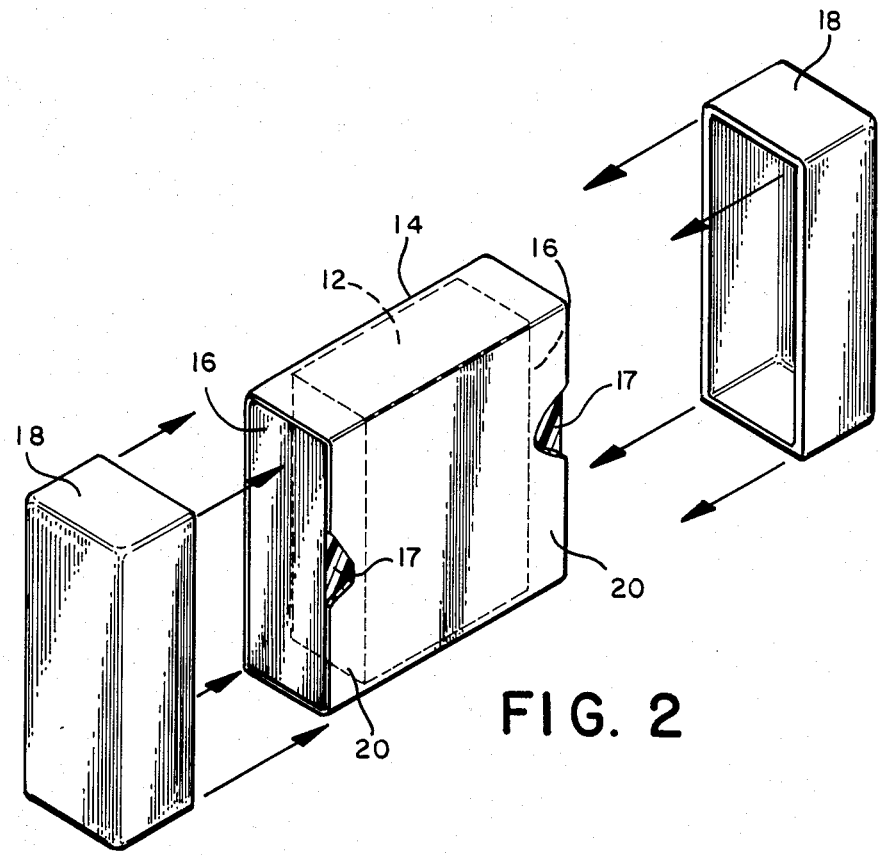

MEANS AND METHOD FOR FABRICATING PLANAR TERMINATED CAPACITORS

This is a continuation-in-part application of U.S. patent application Ser. No. 348,401, filed Feb. 3, 1982, of common inventorship and assignment herewith now U.S. Pat. No. 4,455,591 issued June 19, 1984.

BACKGROUND OF THE INVENTION

A. Field of the Invention

This invention relates to planar terminated capacitors and more particularly to attaching and electrically connecting end caps to capacitor elements.

DESCRIPTION OF THE PRIOR ART

Direct mounting of electrical components, such as wound metallized polyester or metallized polycarbonate capacitors, is useful in thin and thick integrated hybrid circuitry. In previous attempts to accomplish this, unencapsulated capacitors were often used. Such capacitors required careful handling, and their protruding terminal leads were not strong. In fact, even after they were conducted, they could not withstand most military environmental requirements.

Further, since many present day applications required components that could be planar mounted, encapsulated finished components having terminal leads which were already on distributors' shelves could not be utilized.

Also, since such planar connections were usually accomplished by reflow soldering or similar means, it became apparent that what was needed was a component having the strength and versatility of a completed, encapsulated element with terminal leads combined with the advantages of planar external terminal connections.

An ideal capacitor for this type of arrangement is a small chip capacitor of the type described in U.S. Pat. No. 4,378,620 which is hereby incorporated by reference. This capacitor however was formed by bonding a lead to the electrodes in each edge thereby preventing planar mounting. A means for converting these finished electrical components with terminal leads to elements having planar terminations was described in U.S. patent application Ser. No. 348,401. In this method, the leads were cut and end caps were placed over the ends of the component.

It is therefore an object of the present invention to provide planar terminated capacitors which may be fabricated directly from the capacitor elements.

SUMMARY OF THE INVENTION

A planar terminated capacitor and a method for fabricating planar terminated capacitors is disclosed wherein a capacitor element is inserted in a non-conductive tubular sleeve. The sleeve extends outwardly beyond the ends of the capacitor element forming cavities at each end of the sleeve. These cavities are filled with a conductive substance and metal end caps are positioned at the ends of the sleeve substantially enclosing the cavities. The conductive substance electrically couples the end caps to the ends of the capacitor element.

BRIEF DESCRIPTION OF THE FIGURES

FIG. 1 is an illustration of the planar terminated capacitor of the present invention in its finished form.

FIG. 2 is an exploded perspective view of the planar terminated capacitor of FIG. 1.

DETAILED DESCRIPTION OF THE INVENTION

Referring now to FIG. 1 there is shown a representation of the preferred embodiment of planar terminated capacitor 10. As shown capacitor 10 comprises a capacitor element 12 having box-shaped metal end caps 18. Capacitor element 12 is preferably a wound chip capacitor of the type described in U.S. Pat. No. 4,378,620. End caps 18 serve as planar external terminal connections.

Referring now to FIG. 2 there is shown a representation of an intermediate step in the making of capacitor 10. As shown there is a chip capacitor 12 within a non-conductive tubular sleeve 14. Non-conductive tubular sleeve 14 is preferably premolded epoxy, approximately 15 mils thick. Ends 20 of chip capacitor 12 are sprayed with metal to form a conductive terminal on each end. This spraying is performed with a high velocity mixture of compressed air and molten fine particles of tin produced from an electric arc gun.

After spraying, chip capacitor 12 is then inserted into sleeve 14. Sleeve 14 has an overall length of approximately two-tenths of an inch. Sleeve 14 therefore extends beyond ends 20 by approximately 1/32 of an inch on each end forming cavities 16.

Cavities 16 are filled with a conductive substance such as a conductive epoxy 17, preferably containing silver. Conductive epoxy 17 serves to electrically couple ends 20 of capacitor element 12 to end caps 18. While conductive epoxy 17 is wet, metal end caps 18 are slipped over the ends of epoxy sleeve 14 enclosing cavities 16 and the outer edges of the caps extend approximately 1/32 of an inch inwardly from each of the respective ends 20. The dimensions of end caps 18 are approximately one-sixteenth of an inch in the axial direction of sleeve 20, one-tenth of an inch in width and two-tenths of an inch in height. End caps 18 may be nickel silver.

The conductive epoxy 17 within cavities 16 is then heat cured in order to get optimum characteristics. This is followed by a sealing procedure which protects planar terminated capacitor 10 from ambient humidity and cleaning fluid which may be used to clean the circuit board on which capacitor 10 is employed. In this procedure, end caps 18 are masked and conventional vacuum and pressure impregnation is used to cause resin to proceed, by capillary action, into whatever spaces may be present within capacitor 10. End caps 18 are then demasked and planar terminated capacitor 10 is complete.

It will be understood that this planar component now possesses all of the advantages of planar elements. For example, orientation is simplified during manufacture. It is also understood that electric components, other than chip capacitors, may also be used. Such components may be resistors, ceramic capacitors, or the like.

Although the present invention has been described with respect to details of certain embodiments thereof, it is not intended that such details be limitations upon the scope of the invention.

For example, the present invention is not limited to smaller metallized film capacitors, but is also applicable to other components in general and their method of being formed into planar terminated components.

What is claimed is:

1. A planar terminated capacitor comprising:

(a) a capacitor element having first and second terminals at opposite ends thereof;

(b) a non-conductive sleeve surrounding said capacitor element with the ends of said sleeve extending outwardly substantially beyond said first and second terminals forming first and second cavities;

(c) a conductive substance substantially filling and sealing the cavities and engaging and electrically coupled to the terminals; and (d) first and second metal end caps individually positioned at opposite ends of the sleeve distant from the terminals and substantially enclosing the first and second cavities and engaging and electrically coupled to the conductive substance, the first and second end caps being electrically coupled to the first and second terminals respectively only through the conductive substance but free of direct engagement with the first and second terminals.

2. The planar terminated capacitor of claim 1 wherein the sleeve comprises a premolded non-conductive epoxy sleeve.

3. The planar terminated capacitor of claim 1 wherein the conductive substance comprises a conductive epoxy.

4. The planar terminated capacitor of claim 1 wherein a humidity seal is provided by means of vacuum impregnation with resin.

5. The planar terminated capacitor of claim 1 wherein the edges of the metal caps extend inwardly from the respective ends of the sleeve.

6. A method of fabricating a planar terminated component comprising:

(a) inserting a capacitor element into a non-conductive tubular sleeve said capacitor element having first and second terminals at opposite ends wherein the ends of said sleeve extend outwardly substantially beyond said terminals forming first and second cavities;

(b) substantially filling and sealing the cavities with a conductive substance engaging and electrically coupled to the terminals; and (c) individually positioning first and second metal end caps at opposite ends of the sleeve distant from the terminals and substantially enclosing the first and second cavities and engaging and electrically coupled to the conductive substance, the first and second end caps being electrically coupled to the first and second terminals respectively only through the conductive substance but free of direct engagement with the first and second terminals.

7. The method of fabricating a planar terminated capacitor of claim 6 wherein the sleeve comprises a premolded non-conductive epoxy sleeve.

8. The method of fabricating a planar terminated capacitor of claim 6 wherein the conductive substance comprises a conductive epoxy.

9. The method of fabricating planar terminated capacitor of claim 6 wherein the capacitor is humidity sealed by means of vacuum and pressure impregnation with resin.

* * * * *